United States Patent [19]

Kraus

[11] 3,904,810

[45] Sept. 9, 1975

[54] HOUSING FOR SHIELDING ELECTRICAL DEVICES FROM HIGH FREQUENCY ELECTROMAGNETIC RADIATION INTERFERENCE

[75] Inventor: Maximilian Kraus, Ebersberg, Germany

[73] Assignee: Siemens Aktiengesellschaft, Berlin and Munich, Germany

[22] Filed: Sept. 14, 1973

[21] Appl. No.: 397,404

[30] Foreign Application Priority Data

Sept. 25, 1972 Germany........................... 2247005

[52] U.S. Cl................. 174/35 MS; 29/624; 49/480; 49/485; 174/35 GC

[51] Int. Cl.² ........................................... H05K 9/00

[58] Field of Search..... 174/35 MS, 35 GC; 29/624; 277/235 R; 200/61.78, 61.81; 49/480, 485, 490

[56] References Cited

UNITED STATES PATENTS

| | | | |
|---|---|---|---|
| 2,727,084 | 12/1955 | Schreiber | 174/35 GC |
| 2,756,468 | 7/1956 | Bright | 49/490 |
| 2,958,754 | 11/1960 | Hahn | 174/35 MS UX |
| 3,296,356 | 1/1967 | McAdams | 174/35 GC |
| 3,594,490 | 7/1971 | Mitchell et al. | 174/35 GC X |

OTHER PUBLICATIONS

Lockhart, "Fingerstock Expander," IBM Technical Disclosure Bulletin, Vol. 12, No. 3, August, 1969, p. 413.

*Primary Examiner*—Darrell L. Clay
*Attorney, Agent, or Firm*—Hill, Gross, Simpson, Van Santen, Steadman, Chiara & Simpson

[57] ABSTRACT

The joints between access doors and door frames of shield housings for electrical devices are provided with contact springs which are resiliently conformable to variables in joint spacing and which are equipped to provide multiple wiping contact with the surfaces of the doors and frames for electrical conduction efficiency and to minimize contact resistance between the door and housing. The arrangement is such that the contact springs can be mounted on the door after finish has been applied to the door as by electrophoresis.

13 Claims, 4 Drawing Figures

HOUSING FOR SHIELDING ELECTRICAL DEVICES FROM HIGH FREQUENCY ELECTROMAGNETIC RADIATION INTERFERENCE

This invention relates in general to housings for shielding electrical devices against high frequency electro magnetic radiation interference, and is more particularly concerned with effecting electrical connection between the access doors of such housings and the remainder of the housings in a manner to assure efficient electrical conductivity and low contact resistance in the joint between the doors and the housings.

Numerous electrical devices and machines, and more particularly electronic devices which operate with low voltage signals, are quite sensitive to electro magnetic radiation interference. Steps must therefore be taken to shield such devices against the radiation interference which may be emitted from adjoining machines or interfering transmitters. Basically, this may be achieved by means of enclosing housings having electrically conductive walls and which are generally provided in any event for other purposes as well. For test purposes and for maintenance, however, it is generally necessary to provide for easy access into the housings. While cover plates may be provided, this necessitates removal of numerous screws in order to gain access to the inside of the housing. Therefore in order to facilitate access, cabinet type hinged doors are generally provided, but this raises the problem of attaining good electrical conductivity between the door and the housing frame but of maintaining a low order of contact resistance.

A number of expedients have heretofore been proposed which in general require a contact spring arrangement in the contact surface area between the door frame and the housing frame. Often these contact springs have a plurality of segments in order to assure mechanical contact between the surfaces at a number of points. However, the problem of securing an efficient shield, and more particularly contact between the door and the housing must be considered not in an isolated sense, but in relation to the overall manufacturing requirements and steps, such, for example the construction in general, the application of finishes to the housing, etc. For example, certain expedients entail costly manufacturing steps because bare metallic contact surfaces are required between the door frame and housing frame and the shielding contact spring structure. To leave the small contact areas uncoated entails uneconomic and expensive procedures in order to leave the bare metal parts uncoated. To accomplish this, expensive hand finishing has been required.

For example, in German published application No. 2,134,815 published Jan. 20, 1972 there is described a shield housing arrangement involving the costly coating of the housing with a metallic layer which is intended to provide a good electrically conducting contact between the housing and the doors. This is achieved by spraying the electrically conductive paint onto the housing doors and the frame. Inasmuch as the electrically conductive paint does not have the same conductivity as can be attained with the bare metal, electrically conducting metal strips are provided in addition on the contact surfaces between the door and the frame. Such metal strips are intended to enlarge the contact surface on the layer of electrically conducting paint so that the contact resistance will be reduced to similar values as are secured with bare metal surfaces. The metal strips according to such prior disclosure may have variable profiles and are mounted to the frame part with the rivets or screws. However the prior proposal is not a satisfactory solution for the problem of producing a safe shielding and which assures a low contact resistance between the doors and the housing and which permits of a simple and economical manufacture of the housing. A housing coated with conductive paint is of poorer characteristics in comparison with a metallic surface. In addition special cover plates, that is the metal strips, are required to provide a metallic conductive surface. Further, in order to assure functioning of the cover plates or metal strips, they must be mounted to the frame part of the door in such a way that a large area contact occurs between the door frame and the metal strips under the closing pressure. In addition, a direct metallic contact must be provided at the individual screwed on parts. Therefore, the prior scheme merely shifts the basic problem to a different level but does not provide a wholly satisfactory solution.

It is therefore an important object of the present invention to overcome the foregoing and other disadvantages, deficiencies, inefficiencies, shortcomings and problems in prior contact arrangements between the doors and frames of shielding housings, and to provide a new and improved, advantageous structure and method for providing electrical contact betwen the doors and housing frames of housings for shielding against high frequency electrical radiation interference, and to attain this end in such a way that contact springs can be easily mounted, that the springs have a direct metallic contact with the door frame and the housing frame, and that in addition manufacturing of the doors, and the entire housing can be performed easily and economically enabling, for example coating of the doors electrophoretically.

Another object of the invention is to provide a new and improved construction and method for the intended purpose according to which the contact springs can be mounted on the door after the door has been coated with a desired finish.

A further object of the invention is to provide a new and improved contact spring arrangement for the doors of shield housings, having improved wiping contact characteristics.

Other objects, features and advantages of the invention will be readily apparent from the following description of a preferred embodiment thereof, taken in conjunction with the accompanying drawings, although variations and modifications may be effected without departing from the spirit and scope of the novel concepts embodied in the disclosure, and in which.

Figure 2:
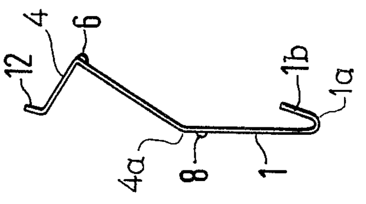
FIG. 2 is an elevational view of the spring strip of FIG. 1, looking in the direction of the arrows on line II—II in FIG. 1, and on an enlarged scale.

According to the present invention, spring means are provided, preferably in the form of spring strips 1 constructed and arranged to be attached by means of mounting strips 2 on a shield housing access door 3 and with spring fingers 4 of the strips properly located adjacent marginal frame means 5 of the door to make electrically sound contact through protuberances 6 with frame means 7 of the housing about the opening closed by the door. It will be understood that the shielding housing schematically represented in FIG. 4 by the door 3 and the frame 7 will be made from electrically conductive material such as sheet metal and will have walls of suitable configuration to provide a shielding enclosure for one or more electrical devices which must be shielded against high frequency electromagnetic radiation interference and into which housing free access must be had through the opening normally closed by the door 3 and which door must be for that purpose mounted on the housing in a manner to be readily opened and closed inasmuch as it is difficult to effect a good electrical contact betwen the margins of the door and the housing about the access opening, and more particularly the frame of the housing. The contact springs 1 supply the need and are so placed that when the door 3 is closed assurance of thorough electrical connection between the door and the housing is attained. It will be understood that the length and number of the springs 1 can be readily conformed to the configuration of the margin of the door 3 with the springs being in generally end to end relationship on and about such margin, or at least at selected locations on the margin to provide the necessary electrical connection between the door 3 and the housing.

By reliance upon the springs 1 to effect electrical connection between the door 3 and the housing 7, the door profile may be produced as a welded sheet steel profile. Further, the mounting strips 2 can be made from suitable sheet metal, formed to shape and nickel plated before assembly with the door in any suitable matter to effect sound electrical connection therewith. Further, the construction and arrangement of the springs is such that they are adapted to be mounted on the door after suitable coated finish has been applied to the door and which may be effected as by means of low cost electrophoresis, with any contact surfaces easily covered by means of a masking tape such as plastic film strips, for example applied over the mounting strips 2 on the door since those strips are in fixed electrical contact with the door, and electrical contact with the door is effected by the springs 1 through the mounting strips 2.

Figure 4:
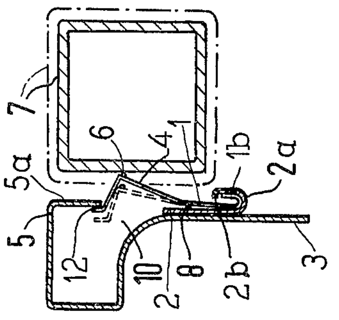
FIG. 4 is a schematic sectional detail view taken substantially along the line IV—IV in FIG. 3.
Figure 1:
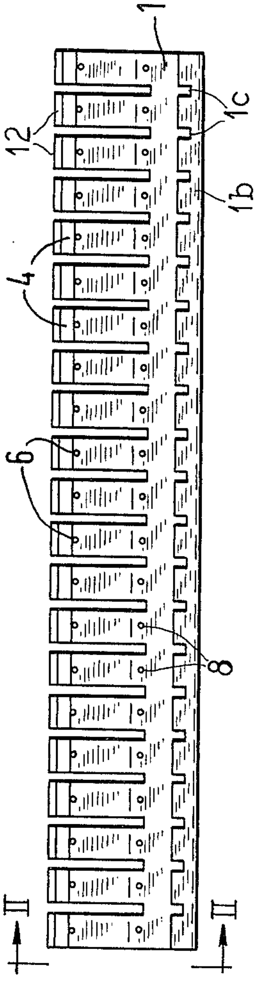
FIG. 1 is a face elevational view of a contact spring strip embodying features of the invention.
Figure 3:
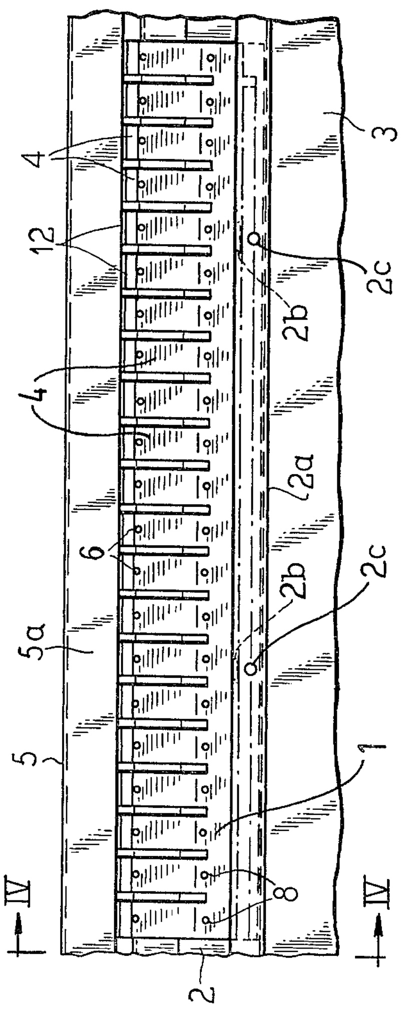
FIG. 3 is a fragmentary elevational view of a shield housing door showing the spring strip mounted thereon.

For receiving the spring strip of strips 1 in a snapped into position mounted relationship, the mounting strip 2 is constructed with an elongated body of substantial width and shaped to engage in face-to-face contact with a face surface of the door 3 which opposes the housing frame 7 in the closed relation of the door, the strip 2 extending along the door face generally parallel to and spaced from the door frame 5 which, in this instance, as shown in FIG. 4, comprises a hollow bar-shaped marginal profile on the door panel. In a preferred form, the mounting strip 2 is of generally J-shape in cross section having its widest portion engaged against the panel of the door 3 and permanently secured thereto as by means of projection welding which will avoid damaging the nickel plated finish of the strip 2, this strip being the only nickel plated part used on the door. At its margin remote from the door frame 5, the mounting strip 2 has a turned generally U-shape socket *2a* within which is retainingly received by transverse relative assembly a complementary turned anchoring formation 1a along the continuous edge of the spring strip 1 opposite to the fingers 4. For tight engagement within the socket *2a*, the formation 1a is provided with an expansile normally flaring lip *1b* separated by notches *1c* into flexible tongues which are resiliently deflected and thus tensioned within the narrower profile of the socket *2a*, thereby pressing the body of the spring strip 1 tightly into engagement with the body of the mounting strip 2. To interlock the spring strip 1 with the mounting strip 2 against unintentional displacement, the terminal edge along the socket formation *2a* is provided at spaced intervals with inturned short interlock lugs *2b* arranged to overlie the tips of certain of the tongues of the anchoring formation lip 1d, the space between the tips of the lugs *2b* and the body of the strip 2 being sufficient to permit snapping of the lip *1b* past the lugs *2b* to the assembled relationship. Thereafter the strip 1 can be removed only by depressing the tongues aligned with the lugs *2b* to escape the lugs. For this purpose, the turned flange forming the socket *2a* is provided with small access holes *2c* aligned with the lugs *2b* and through which a pin may be inserted to press the affected portion of the lip *1b* into clearance relation to the adjacent lug *2b* so that the spring strip 1 can then be pulled free from the socket *2a*.

In order to assure thorough contact of the spring protuberances 6 with the housing frame 7, the spring fingers 4 are biased across the gap between the door and the frame to a slightly greater extent than the normal spacing of said gap. Such biasing is provided for by having the fingers 4 bent angularly along a line *4a* adjacent to their juncture with the solid body of the spring 1 to extend angularly obliquely toward the housing frame 7 with the protuberances 6 at the points of maximum projection and from which end portions of the fingers extend obliquely in the opposite direction toward the door frame 5. Through this arrangement, each of the spring fingers 4 is arranged to make electrical contact with the door frame 7 through its protuberance 6 and by the large number of the fingers 4 full compensation for any variables along the length of the frame 7 will be accommodated since each of the fingers can find its optimum contact engagement with the frame due to its resilient flexibility and individual tensioned thrust against the frame. In addition, by reason of the length and resilient flexibility of the fingers 4, various dimensional relationships having regard to the frame 7 can be accommodated. Thus, having regard to FIG. 4, the fingers 4 can accommodate the smaller size of frame or at least larger gap spacing represented by the frame 7 in full line, as well as larger sizes or smaller gap spacings as indicated in the dot dash representation of the frame 7.

As the door 3 closes the protuberances 6 of the fingers 4 not only make contact with the frame 7 but also have a slight rubbing wiping action thereagainst, thereby maintaining the electrical contact points provided by the protuberances 6 and the engaged areas on the frame 7 clean and, in effect, bright for assurance of low transitional resistance between the door and the housing. Pressure against the protbuerances 6 in the closed door position assures not only good electrical contact with the frame 7, but also between the spring strip 1 and the mounting strip 2 through spring tensioned action of the spring fingers 4. Means improving assurance of thorough electrical contact between the spring 1 and strip 2 comprise protuberances 8 in the proximal portions of the fingers 4 adjacent to juncture of the fingers with the solid body portion of the strip 1 and which project in the opposite direction from the protuberances. The protuberances 8 press against the plate body of the strip 2 and in the tensioning movement of the fingers 4 have a self-cleaning wiping action against the engaged face of the strip 2, similarly as the protuberances 6 against the frame 7 but possibly to a lesser extent because the nickel plated surface of the strip 2 tends to maintain its bright characteristics more uniformly than may be the case with the exposed contact surface of the frame 7.

In order to assure a tension bias of the fingers 4 toward their electrical contacting engagement with the frame 7 but to avoid having free ends of the spring fingers exposed, and also to provide space for the fingers to move when flexed during engagement with the frame 7, the door frame is constructed to receive the distal end portions of the fingers, being for this purpose provided with a slot 10 into the hollow door frame 5 and which slot opens toward the opposing surface of the housing frame 7 when the door 3 is closed. Through this arrangement, the distal end portions of the fingers 4 extend into the slot 10, and the clearance provided by this slot is ample to permit free flexing movement of the fingers therein as required by tensioning of the fingers in engagement with the frame 7 when the door is closed. To prevent escape of the tensioned fingers 4 from within the slot 10, each of the fingers is provided on its distal end with a terminal flange 12 which fits inside a flange 5*a* of the door frame 5 defining one side of the slot 10. Thereby, in the free tensioned condition of the fingers 4, the terminal flanges 12 may engage against the inside face of the door frame flange 5*a*, from which the terminal flanges can move freely when the fingers are flexed when they make electrical contact with the housing frame 7.

In making the door 3, it is formed to shape as by forming of sheet metal and welding any joints that are necessary. The nickel plated mounting strip 2 is secured in place on the unfinished formed door 3 as by projection welding and thereby becomes a permanent electrically integral part of the door. Then the strip 2 is masked so as to maintain its nickel plated surface clean, and the door is finished with a suitable coat of lacquer, varnish or enamel and this may be accomplished by an inexpensive electrophoresis method, spray painting or the like. Thereafter the masking tape is stripped from the mounting plate strip 2, and the spring strip 1 is mounted by snapping its anchoring terminal flange 1*a*, 1*b* into the turned socket 2*a*, and the distal end portions of the fingers 4 are moved into engagement behind the flange 5*a* by flexing the fingers into position through gap 10. In this mounted position of the contact spring strip 1, the fingers 4 are normally biased under tension away from the door so that after the door is mounted on the housing, the protuberances 6 will make electrical contact with the frame 7 when the door is closed. Should it become necessary to remove the contact spring 1 for any reason, that can be easily effected by pressing in through the holes 2*c* on the tongues of the flange 1*b* interlocked with the interlock lug flanges 2*b*, until those tongues can escape, and the contact spring 1 pulled free from the mounting strip 2. This can be done either before or after the spring fingers 4 are freed from the door frame flange 5*a*, but can be effected a little easier if the fingers are first sprung out clear of the flange 5*a*.

In respect to the housing frame 7, the surface thereof which is electrically engaged by the protuberances 6 may for improved assurance of low transitional resistance between the door and housing be nickel plated or provided with a welded-on nickel plated strip, as preferred, to be engaged by the protuberances 6. In finish coating the housing it is a simple matter to mask the nickel plated contact area of the frame 7 during the coating process, whereafter the bright contact surface is readily exposed by removal of the masking material such as a tape strip.

From the foregoing it will therefore be apparent that the present invention provides for a highly efficient shielding housing construction with assured low transitional resistance between the access door or doors of the housing, and the particular manner of effecting separable connection between the door and the housing according to the present invention permits of the most economical manufacture of the housing. Not only does the housing provide a secure and efficient shield against high frequency of electrical radiation interference with sensitive instruments or apparatus within the housing, but the arrangement of the contact springs is such that they can be easily mounted to provide a direct metallic contact with the door frame or the housing frame and in the closed condition of the door effect assured, efficient separable electrical contact with the opposing contact surface. It will be readily apparent that by simple reversal of parts the contact springs can be mounted on the housing frame 7 through the mounting strips 2 secured to the housing frame, and with the door frame providing the separable engageable contact surface to be engaged by the spring protuberances in the closed condition of the door. In any event, the most economical manufacturing processes may be employed in constructing the doors and the housing, permitting the most efficient and inexpensive process of coating the doors and housing before or after assembly thereof, as for example by electrophoretic coating means.

It will be understood that variations and modifications may be effected without departing from the spirit and scope of the novel concepts of this invention.

I claim as my invention:

1. In an electrically conductive housing for shielding electrical devices against interference from high frequency electrical radiation and having an access opening with a frame area thereabout and an openable electrically conductive door having a marginal frame area thereon opposing the housing frame area entirely around said opening in the closed position of the door:

electrically conductive contact spring strip means extending entirely around said opening;

means connecting said spring strip means along one edge portion thereof in electrical contact to one of said frame areas entirely around said opening;

said spring strip means having resiliently flexible contact fingers integral therewith along the opposite edge of the spring strip means and normally biased toward an interengagement with the other of said frame areas in the closed position of the door;

each of said fingers having a terminal flange on its distal end portion;

means integrally entirely around said one frame area defining a clearance in which said terminal flanges are received for a substantial range of clearance movement as deflected from a maximum biased relation of the fingers to a resiliently deflected relation as pressed toward said one frame area by said other frame area in the closed position of the door, and including a retaining flange entirely along said recess engageable by said terminal flanges to retain them in the recess in the open position of the door;

said connecting means comprising an electrically conductive strip secured in electrically conductive relation to said one frame area and having a turned socket flange therealong having a plurality of interlock lugs; and said spring strip means having along said one edge a complementary turned anchoring formation engaged within said socket and retained against displacement from the socket by said lugs.

2. In a housing according to claim 1, said turned anchoring formation including a lip flange, and said turned socket flange of the connecting means strip having respective holes therein generally aligned with the lugs to enable insertion of a tool into the holes to depress the lip flange out of retaining engagement with said lugs.

3. In a housing according to claim 1, said connecting means including a flange underlying the contact spring strip means, and said contact spring strip means having electrical contact protuberances engaging firmly with said connecting means strip.

4. In a housing according to claim 1, each of said fingers having an intermediate arched portion, and each of said arched portions having a small contact protuberance engaging said other marginal frame area with a rubbing action in the closing of said door.

5. A mounting and contact spring assembly for effecting electrical connection between an access door and a housing frame about an access opening into the housing for shielding electrical devices against interference from high frequency electromagnetic radiation, comprising:

an electrically conductive contact spring mounting strip adapted to be attached to said door or said housing frame and having a turned generally U-shaped socket formation along one edge;

an electrically conductive contact spring strip having a turned expansile tensionable anchoring flange formation along one edge generally complementary to and retainingly engaged in said socket formation by transverse relative assembly placing said flange formation under tension and thereby enhancing thorough electrical contact between said strips;

said contact spring strip having a plurality of partially separated resilient spring contact fingers of substantial width extending from its opposite edge; and each of said fingers having wiping contact protuberance of substantially smaller diameter than said width projecting therefrom for engagement with a confronting electrically conductive surface.

6. An assembly according to claim 5, wherein said socket formation has interlock means with which said anchoring flange formation is snapped into retaining engagement, and said socket formation having access openings therein for insertion of a tool to compress said anchoring flange formation to release the same from said interlock means.

7. In an electrically conductive housing for shielding electrical devices against interference from high frequency electrical radiation and having an access opening with a frame area thereabout and an openable electrically conductive door having a marginal frame area thereon opposing the housing frame area entirely around said opening in the closed position of the door;

electrically conductive contact spring metal strip mounting means permanently electrically connected to one of said frame areas entirely around said opening;

electrically conductive contact spring metal strip means entirely around said opening;

complementary interengaged electrically interconnecting and retaining structure comprising a socket flange formation on said mounting strip and a complementary anchoring flange formation on the spring strip received in the socket in electrically contacting relation;

terminal interlock lugs on said socket flange formation opposing displacement of said spring strip flange formation from the socket;

said spring strip flange formation comprising a plurality of partially separated resilient tongues;

said interlock lugs opposing free ends of certain of such tongues; and said mounting strip flange formation having access holes therein generally aligned with said lugs permitting insertion of a tool through such holes to deflect the tongues relative to said lugs to enable removal of the spring strip from the mounting strip.

8. In an electrically conductive housing according to claim 7, means on said one frame area defining a recess around said opening spaced from said mounting strip, said contact spring strip having a series of relatively resiliently flexible spring contact fingers biased toward and into electrical engagement with said other frame area and provided with terminal flanges extending into said recess, and flange means overlying said recess and engageable by said terminal flanges in the open door position to retain the terminal flanges against escape from said recess.

9. In an electrically conductive housing for shielding electrical devices against interference from high frequency electrical radation and having an access opening with a frame area thereabout and an openable electrially conductive door having a marginal frame area thereon opposing the housing frame area entirely around said opening in the closed position of the door:

electrically conductive contact spring strip means extending entirely around said opening;

means connecting said spring strip means along one edge portion thereof in electrical contact to one of said frame areas entirely around said opening;

said spring strip means having resiliently flexible contact fingers integral therewith along the opposite edge of the spring strip means and normally biased toward an interengagement with the other of said frame areas in the closed position of the door;

each of said fingers having a terminal flange on its distal end portion;

means integrally entirely around said one frame area defining a clearance in which said terminal flanges are received for a substantial range of clearance movement as deflected from a maximum biased relation of the fingers to a resiliently deflected relation as pressed toward said one frame area by said other frame area in the closed position of the door, and including a retaining flange entirely along said recess engageable by said terminal flanges to retain them in the recess in the open position of the door;

said connecting means comprising a strip extending entirely around said opening and being of substantial width in electrical engagement with said one frame area and having a turned generally U-shaped socket flange formation along one margin;

said contact spring strip means having a portion of substantial width engaging said connecting strip and provided with a turned spring flange complementary to and engaged in internested relation within said socket flange formation and tensioned to urge said contact spring strip means into firm electrical engagement with said connecting strip; and interlocking means on said flange formation retaining said turned spring flange against withdrawal from the socket flange formation.

10. In a housing according to claim 9, said retaining flange being flat and overlying said clearance along one side of a slot into said clearance, and said finger terminal flanges being flat and separably engaging flatwise with the inner face of said retaining flange and being thereby held against escape from the clearance in the open position of the door.

11. A mounting and contact spring assembly for effecting electrical connection between an access door and a housing frame about an access opening into the housing for shielding electrical devices against interference from high frequency electromagnetic radiation, comprising:

an electrically conductive contact spring mounting strip adapted to be attached to said door or said housing frame and having a turned generally U-shaped socket formation along one edge;

an electrically conductive contact spring strip having a turned expansile tensionable anchoring flange formation along one edge generally complementary to and retainingly engaged in said socket formation by transverse relative assembly placing said flange formation under tension and thereby enhancing thorough electrical contact between said strips; and said spring contact fingers having wiping contact protuberances biased into engagement with said mounting strip by tensioning of said fingers.

12. A mounting and contact spring assembly for effecting electrical connection between an access door and a housing frame about an access opening into the housing for shielding electrical devices against interference from high frequency electromagnetic radiation, comprising:

an electrically conductive contact spring mounting strip adapted to be attached to said door or said housing frame and having a turned generally U-shaped socket formation along one edge;

an electrically conductive contact spring strip having a turned expansile tensionable anchoring flange formation along one edge generally complementary to and retainingly engaged in said socket formation by transverse relative assembly placing said flange formation under tension and thereby enhancing thorough electrical contact between said strips;

said contact strip having a plurality of partially separated resilient spring contact fingers of substantial width;

each of said fingers having a wiping contact protuberance adjacent to said anchoring flange formation of substantially smaller diameter than said width and pressed into wiping contact with said mounting strip; and each of said fingers having spaced from said first mentioned protuberance a protuberance projecting in the opposite direction and of smaller diameter than said width and adapted to effect wiping contact with an electrically conductive surface confronting said fingers.

13. A mounting and contact spring assembly for effecting electrical connection between an access door and a housing frame about an access opening into the housing for shielding electrical devices against interference from high frequency electromagnetic radiation, comprising:

an electrically conductive contact spring mounting strip adapted to be attached to said door or said housing frame and having a turned generally U-shaped socket formation along one edge;

an electrically conductive contact spring strip having a turned expansile tensionable anchoring flange formation along one edge generally complementary to and retainingly engaged in said socket formation by transverse relative assembly placing said flange formation under tension and thereby enhancing thorough electrical contact between said strips;

said socket formation having interlock means with which said anchoring flange formation is snapped into retaining engagement;

said socket formation having access openings therein for insertion of a tool to compress said anchoring flange formation to release the same from said interlock means;

said anchoring flange formation having a series of tongues and said interlock means comprising lugs behind which said tongues are engaged; and said access openings being generally aligned with said lugs to enable engagement of the tool with said tongues to depress them and thus free them from the lugs.

* * * * *